(12) United States Patent
Yang et al.

(10) Patent No.: US 7,302,245 B2
(45) Date of Patent: *Nov. 27, 2007

(54) METHOD AND APPARATUS FOR ESTIMATING AND CONTROLLING INITIAL TIME SLOT GAIN IN A WIRELESS COMMUNICATION SYSTEM

(75) Inventors: Rui Yang, Greenlawn, NY (US); Donald M. Grieco, Manhassett, NY (US); Leonid Kazakevich, Plainview, NY (US)

(73) Assignee: InterDigital Technology Corporation, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/327,864

(22) Filed: Jan. 9, 2006

(65) Prior Publication Data

US 2006/0111061 A1    May 25, 2006

Related U.S. Application Data

(63) Continuation of application No. 11/041,784, filed on Jan. 24, 2005, now Pat. No. 7,039,378, which is a continuation of application No. 10/686,055, filed on Oct. 14, 2003, now Pat. No. 6,873,833.

(60) Provisional application No. 60/458,347, filed on Mar. 27, 2003.

(51) Int. Cl.
*H04Q 7/20* (2006.01)

(52) U.S. Cl. .............................. 455/232.1; 455/234.1; 455/240.1

(58) Field of Classification Search ............. 455/232.1, 455/234.1, 240.1, 127.2, 127.3, 136, 138, 455/219, 222, 164.1, 182.2, 192.2, 250.1; 324/322, 318, 309; 327/306, 91, 331; 330/283, 330/284, 86
See application file for complete search history.

(56) References Cited

U.S. PATENT DOCUMENTS

| 3,944,942 A | 3/1976 | Chudleigh, Jr. |
| 5,083,304 A | 1/1992 | Cahill |
| 5,631,921 A | 5/1997 | Schilling |

(Continued)

FOREIGN PATENT DOCUMENTS

EP    1 209 870    5/2002

(Continued)

OTHER PUBLICATIONS

Mihailescu et al. "Dynamic Resource Allocation for Packet Transmission in UMTS TDD TD-CDMA Systems"; 1999 IEEE 49th Vehicular TEchnology Conference, May 16-20, 1999, vol. 2, Conf. 49, pp. 1737-1741.

*Primary Examiner*—Jean Gelin
(74) *Attorney, Agent, or Firm*—Volpe and Koenig, P.C.

(57) ABSTRACT

In a time-division duplex (TDD) system, a reliable initialization scheme that is applicable to an automatic gain controller (AGC) at a base station is implemented in various forms depending on the availability of certain information such as signal-to-interference ratio (SIR), spreading factors and other parameters. A more accurate estimation of the initial control word of a gain-adjustable amplifier for one or more time slots is implemented. The scheme is applicable to AGC initialization for each time slot of the TDD system, but is also applicable to other systems of transmission, without limitation.

18 Claims, 3 Drawing Sheets

U.S. PATENT DOCUMENTS

| | | |
|---|---|---|
| 6,002,713 A | 12/1999 | Goldstein et al. |
| 6,025,720 A | 2/2000 | Lenz et al. |
| 6,167,244 A | 12/2000 | Tomoe |
| 2002/0048267 A1 | 4/2002 | Jaques et al. |
| 2002/0054583 A1 | 5/2002 | Olesen et al. |
| 2003/0026363 A1 | 2/2003 | Stoter et al. |
| 2003/0031162 A1 | 2/2003 | Chitrapu et al. |

FOREIGN PATENT DOCUMENTS

| | | |
|---|---|---|
| WO | 03/001681 | 1/2003 |

US 7,302,245 B2

METHOD AND APPARATUS FOR ESTIMATING AND CONTROLLING INITIAL TIME SLOT GAIN IN A WIRELESS COMMUNICATION SYSTEM

CROSS REFERENCE TO RELATED APPLICATIONS

This application is a continuation of U.S. patent application Ser. No. 11/041,784 filed Jan. 24, 2005, which issued as U.S. Pat. No. 7.039,378 on May 2, 2006, which is a continuation of U.S. patent application Ser. No. 10/686,055 filed Oct. 14, 2003, which issued as U.S. Pat. No. 6,873,833 on Mar. 29, 2005. which claims the benefit of priority from U.S. Provisional Application No. 60/458,347, filed Mar. 27, 2003, which are incorporated by reference as if fully set forth.

FIELD OF INVENTION

This invention generally relates to an automatic gain controller (AGC) used in a wireless communication system. In particular, the invention relates to a reliable initialization scheme for estimating and controlling initial time slot gain control signals in a base station (BS) AGC.

BACKGROUND

In most wireless communication systems, the baseband signal at the receiver needs to be converted from analog format into digital format so that useful information can be recovered via a sequence of digital processes. The common device that achieves this conversion is an analog-to-digital converter (ADC). Given the number of output bits of the ADC, if the power of the input signal is too large, the output of the ADC may be saturated. On the other hand, if the power of the input signal is too small, the input signal may be severely quantized. In both cases, the information to be recovered at the received end may be lost. A common approach to solve this problem is to apply a dynamically adjustable gain amplifier in front of the ADC so that the input signal of the ADC can be maintained at a desired level.

Typically, the adjustable gain is controlled using a closed-loop mechanism, as shown in FIG. 1, which is also called an AGC 100. The AGC 100 includes two gain-adjustable amplifiers 105A and 105B, two ADCs 110A and 110B, a digital signal power estimator 115, a power comparator 120 and an accumulator 125. If the gain-adjustable amplifiers are controlled by an analog signal, a digital-to-analog converter (DAC) (not shown) may be inserted between the accumulator 125 and the gain-adjustable amplifiers 105A and 105B, or the DAC may be incorporated within the amplifiers 105A and 105B.

The gain-adjustable amplifiers 105A and 105B amplify or attenuate in-phase signal I and quadrature baseband signal Q. Signal I is received via an input 130 of gain-adjustable amplifier 105A and signal Q is received via an input 135 of gain-adjustable amplifier 105B. The ADCs 110A, 110B convert the amplified or attenuated analog signals and convert them into digital format.

Referring still to FIG. 1, the digital signal power estimator 115 estimates the total power of the digital signal at the output of power estimator 115. The comparator 120 compares the estimated digital signal input power 140 output from power estimator 115 with a power reference value $P_{ref}$ 145 and generates an error signal 150 which represents the difference between the estimated input signal power 140 and the power reference value $P_{ref}$ 145. The error signal 150 is then accumulated by the accumulator 125. Accumulator 125 outputs a gain control signal 155 having a control word w which is used to control the gain of the gain-adjustable amplifiers 105A, 105B. The gain control signal 155 depends not only on the power errors accumulated over time, but also on the initial value of the accumulator 125.

In many conventional digital communication systems, the input signal of an AGC is a continuous and smooth signal waveform. The power variation of the input signal is usually due to channel fading or power control and, therefore, such a power variation is slow relative to the dynamics of the AGC loop. Under this condition, the AGC loop will operate continuously without any interruption and the initial value of the accumulator is not important.

For digital communication systems using time division duplex (TDD) technology, there is a potentially large slot-to-slot variation of the received power, as shown in FIG. 2. This slot-to-slot power variation is primarily due to the fact that the systems using TDD technology can flexibly change the number of data bursts, which are spread with different codes and superimposed together in each time slot, over time. Owing to this power variation, the AGC 100 is required to be able to set the gain in front of the ADCs 110A, 110B quickly and correctly. Otherwise, the data at the beginning of the time slot may be lost due to either saturation or severe quantization. To meet this requirement, the accumulator 125 must be restarted with an accurate initial value such that an initial gain control signal is provided to the gain-adjustable amplifiers 105A, 105B at the beginning of each time slot. The initial gain value of the gain-adjustable amplifiers 105A, 105B directly depends upon the initial value provided by the accumulator 125.

What is needed is a method and apparatus to accurately determine the initial value of the accumulator 125 at the beginning of each uplink time slot at the base station, based on the level of information available at the base station.

SUMMARY OF THE INVENTION

The present invention provides a reliable initialization scheme that is applicable to an AGC. The scheme can be implemented in various forms depending on the availability of certain information, such as a signal-to-interference ratio (SIR), spreading factors, and other parameters.

Preferably, the present invention is implemented in a wireless communication system including an automatic gain controller (AGC). Initial time slot gain control signals are estimated and controlled by inputting an initial input signal in front of a gain-adjustable amplifier for a j'th timeslot in a k'th frame. A control word $w_I[k-1, j]$ is applied to the gain-adjustable amplifier at the end of the j'th timeslot in the (k−1)'th frame. The initial input power is estimated based on the power measurement of the time slot j in the previous frame k−1 by removing the power of code signals that will disappear from the incoming time slot, and adding the power of new code signals that will arrive in the incoming time slot.

BRIEF DESCRIPTION OF THE DRAWINGS

A more detailed understanding of the invention may be had from the following description of a preferred example, given by way of example and to be understood in conjunction with the accompanying drawing wherein.

DETAILED DESCRIPTION OF THE PREFERRED EMBODIMENT(S)

Figure 1:
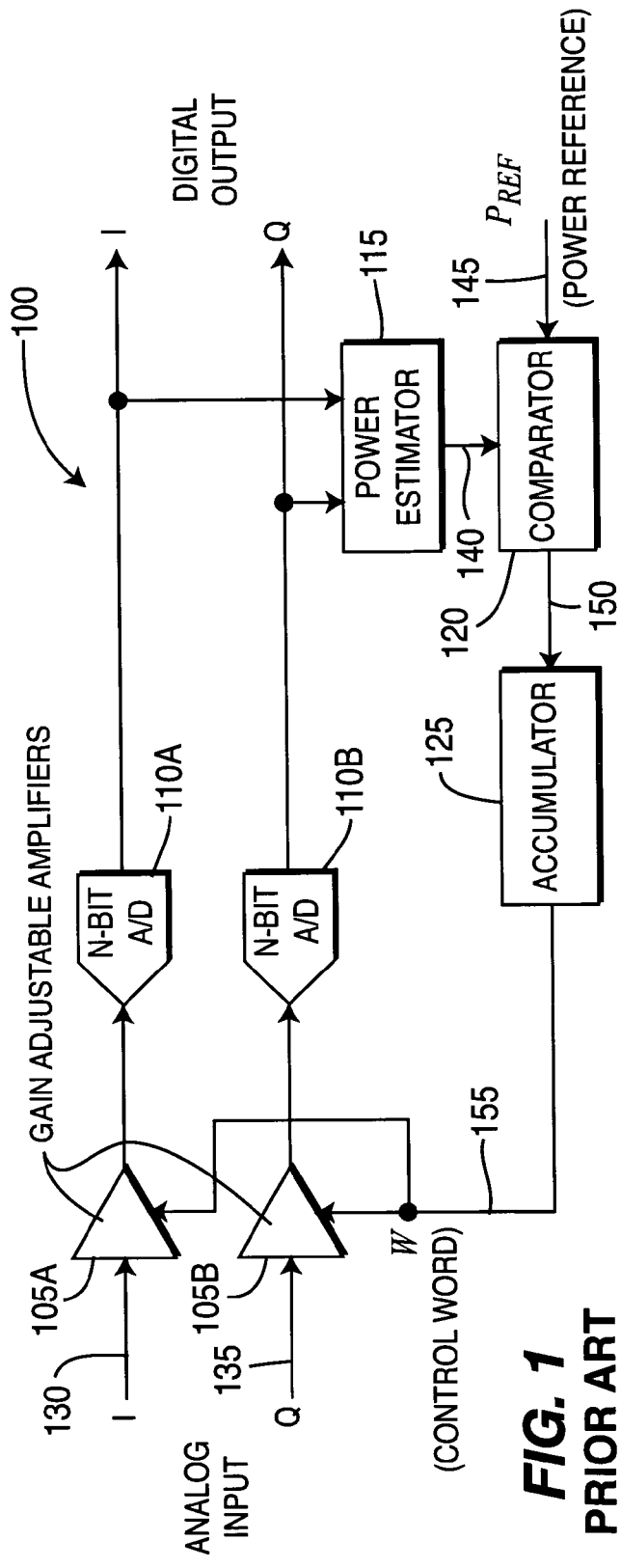
FIG. 1 illustrates a conventional AGC arrangement.
Figure 2:
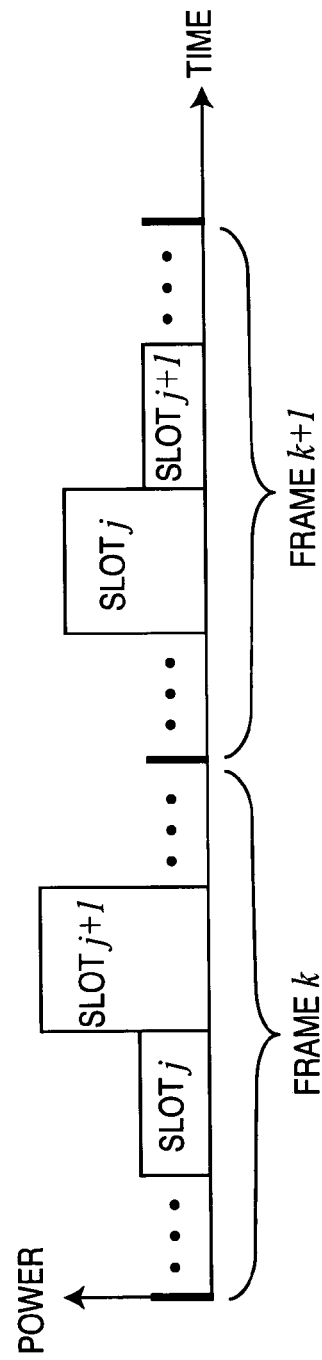
FIG. 2 illustrates a TDD radio frame structure and power profile.

The present invention will be described with reference to the drawing figures wherein like numerals represent like elements throughout. The following description presents algorithms, with respect to different levels of assumption, to estimate the initial power control signal using such information.

While the description that follows is specifically explained as applicable to TDD and TDS CDMA (time division synchronous code-division multiple access), it is to be noted that the invention in its broad form is also applicable to other systems of transmission, without limitation.

Hereafter, a wireless transmit/receive unit (WTRU) includes but is not limited to a user equipment, mobile station, fixed or mobile subscriber unit, pager, or any other type of device capable of operating in a wireless environment. When referred to hereafter, a base station includes but is not limited to a base station, Node-B, site controller, access point or other interfacing device in a wireless environment.

Figure 3:
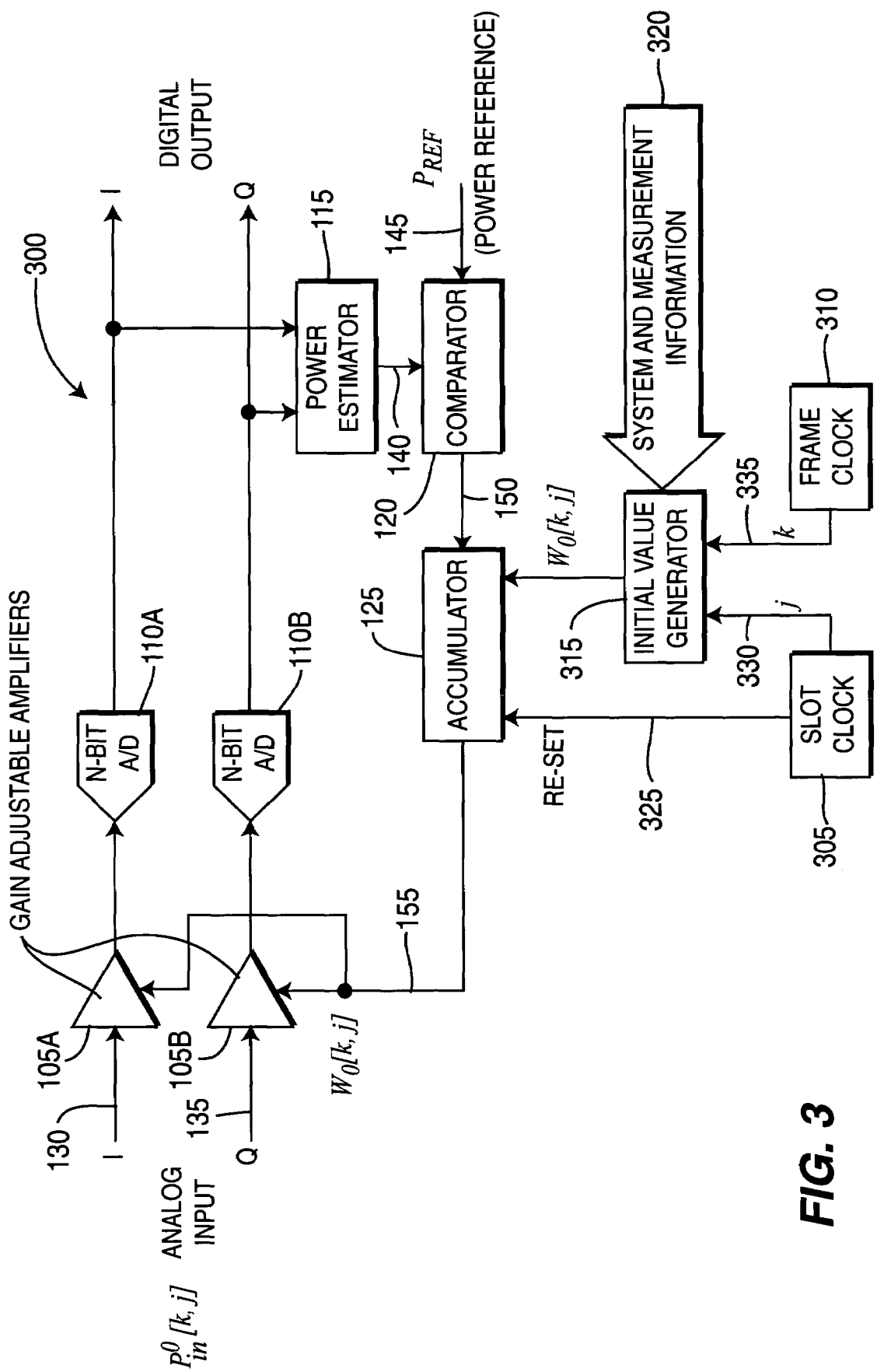
FIG. 3 illustrates an AGC operating in accordance with the present invention where $P_{in}^0[k, j]$ is the initial input signal power in front of a gain-adjustable amplifier for the j'th timeslot in the k'th frame.

FIG. 3 shows an AGC 300 operating in accordance with the present invention. The AGC 300 is similar to AGC 100, except that it further includes a slot clock 305, a frame clock 310 and an initial value generator 315. The slot clock 305 generates a reset signal 325 and sends it to the accumulator 125 at the beginning of each time slot. This reset signal 325 is used to signal the accumulator 125 to replace the data kept in the memory of the accumulator 125 with a new value that is newly computed by the initial value generator 315 and sent to the accumulator 125.

Figure 4:
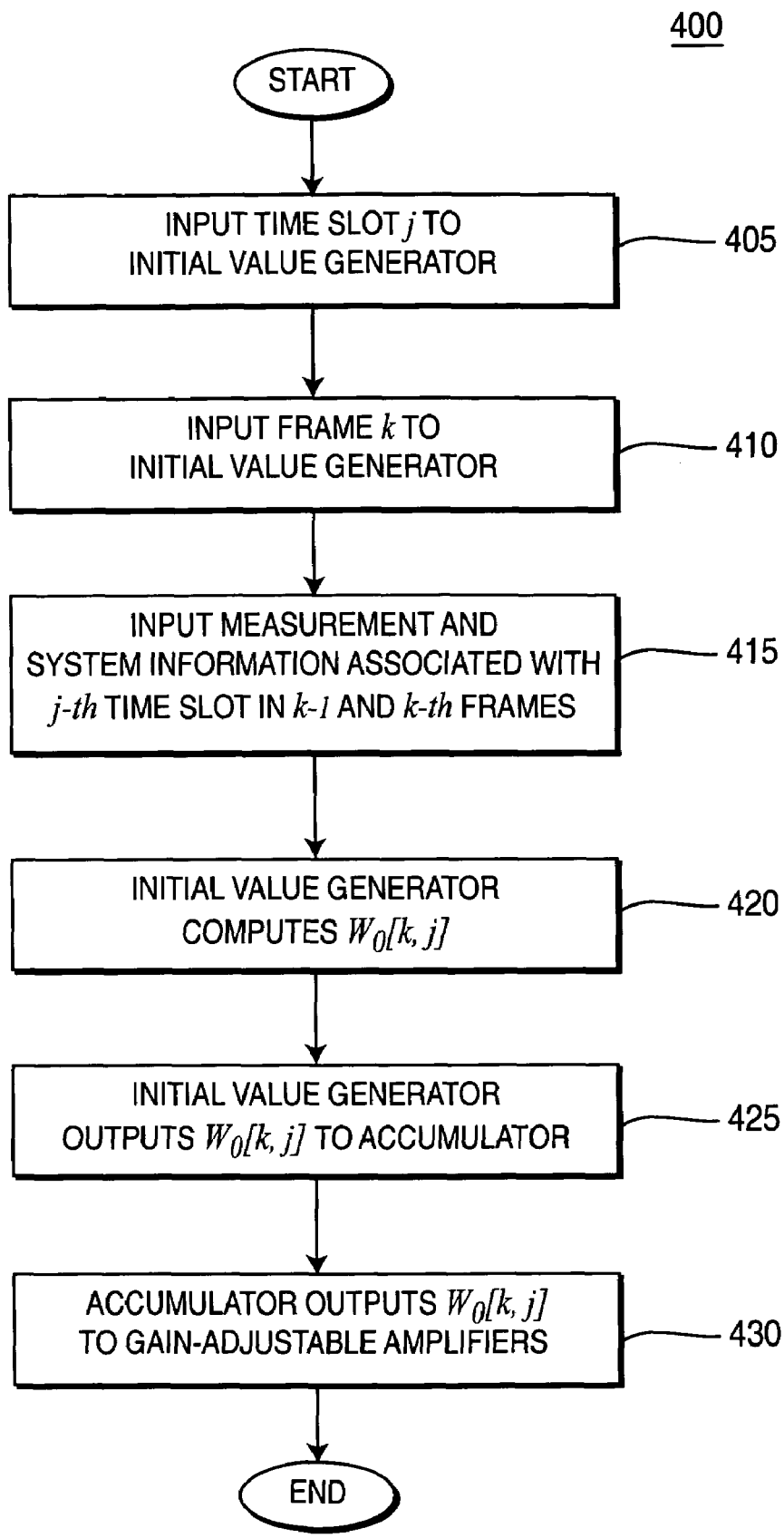
FIG. 4 is a flow chart illustrating method steps implemented by the AGC of FIG. 3.

FIG. 4 is a flow chart of a method 400 implemented by AGC 300. In step 405, the slot clock 305 generates an index (j) 330 of the current time slot. In step 410, the frame clock 310 generates an index (k) 335 of the current frame. The initial value generator 315 receives the index (j) from the slot clock 305 and the index (k) from the frame clock 310 and calculates the initial control word $w_0[k, j]$ in response to reset signal 325. It is assumed that the j'th time slot is an uplink time slot.

In general, the rate of the slot clock 305 is N times higher than that of the frame clock 310, where N is the number of time slots per frame. Using these indices, $w_0[k, j]$ is denoted as the initial control word of the gain-adjustable amplifiers 105A and 105B for the j'th timeslot in the k'th frame. In step 415, system information and existing measurements 320 associated with the current (j'th) time slot in the k−1 and k'th frames is input into the initial value generator 315. At the beginning of each time slot, the initial value generator 315 computes the initial value of the accumulator 125 based on the system and existing measurements 320 (step 420), which is the same as the initial control word $w_0[k, j]$ of the gain-adjustable amplifiers 105A, 105B, for the current time slot (j'th) and current frame (k'th). In step 425, once the new initial control word $w_0[k, j]$ is available, it is sent to the accumulator 125. Upon receipt of the reset signal 325, the accumulator 125 outputs the new initial control word $w_0[k, j]$ to the gain-adjustable amplifiers 105A, 105B. The gain value of the gain-adjustable amplifiers 105A, 105B is then reset (step 430). Ideally, if the initial control word $w_0[k, j]$ is computed accurately, the initial output power at the beginning of the time slot will be very close to the reference power $P_{ref}$ 145. As a result, minimal adjustment will be needed at the gain-adjustable amplifiers 105A, 105B during the time period of this time slot. Mathematically, this desired condition can be represented as:

$$P_{ref} = G_{ADC} 10^{bw_0[k,j] + \alpha} P_{in}^0[k, j] \qquad \text{Equation 1}$$

where $P_{ref}$ is the reference power (or the desired output power) of the ADCs 110A, 110B, $G_{ADC}$ is the power gain of the ADCs 110A, 110B, $P_{in}^0[k, j]$ is the initial input signal power in front of the gain-adjustable amplifiers 105A and 105B for the j'th timeslot in the k'th frame, $w_0[k, j]$ is the initial control word w for the j'th timeslot in the k'th frame and $10^{bw+\alpha}$ is the model of gain-adjustable amplifiers 105A and 105B. The variables b and α are characteristic parameters which are usually provided by manufacturers of gain-adjustable amplifiers 105A and 105B as part of their respective unit specifications.

From Equation 1, the initial control word $w_0[k, j]$ for the gain-adjustable amplifiers 105A and 105B can be expressed as $$w_0[k, j] = \frac{1}{b}\left(\log\left(\frac{P_{ref}}{G_{ADC} P_{in}^0[k, j]}\right) - \alpha\right) \qquad \text{Equation 2}$$

On the right hand side of Equation 2, only the initial input signal power $P_{in}^0[k, j]$ is unknown. The present invention provides a method for estimating the initial input signal power $P_{in}^0[k, j]$. The estimated $P_{in}^0[k, j]$ is denoted as $\hat{P}_{in}^0 k$, Equation 2 becomes:

$$w_0[k, j] = \frac{1}{b}\left(\log\left(\frac{P_{ref}}{G_{ADC} \hat{P}_{in}^0[k, j]}\right) - \alpha\right) \qquad \text{Equation 3}$$

The estimation accuracy of input power $P_{in}^0[k, j]$ depends on the availability of the system and measurement information 320. The following description presents algorithms with respect to different levels of assumption about the availability of the system and measurement information 320.

In a first preferred embodiment, it is assumed that a receiver (e.g., in the base station (BS)) containing the AGC 300 knows all of the information about newly acquired data, and that the data that will disappear in the upcoming timeslot. Since the AGC 300 is located at the BS of a TDD communication system, for example, the information, such as spreading codes and SIR about the arriving data and disappearing data may be known at the BS. Using the above assumption, the present invention estimates the initial input power, based on the power measurement of this time slot j in the previous frame k−1 by (1) removing the power of the signals that will disappear from the incoming time slot j of frame k and (2) adding the power of the new signals that will arrive in the incoming time slot j of frame k.

For example, let the number of appearing new codes be $N_1$. Let $\{SIR_i^{target}[k, j], i=1, \ldots, N_1\}$ be the target SIRs. Let $\{SF_i, i=1, \ldots, N_1\}$ be the spreading factors for those codes in the j'th timeslot of the k'th frame. Let the number of disappeared old codes be $N_2$. Let $\{SIR_i^{measure}[k-1, j], i=1, \ldots, N_2\}$ be the measured SIRs. Let $\{SF_i, i=N_1+1, \ldots, N_1+N_2\}$ be the spreading factors for those codes in the j'th timeslot of the (k−1)'th frame. In addition, let $\bar{P}_{est}[k-1, j]$ be the average power measurement at the output of the ADC 110 and let $\hat{P}_{interf}[k-1, j]$ be the interference power estimation as an output of the channel estimation algorithm for the j'th timeslot in the (k−1)'th frame, respectively. Then, the estimated input power for the j'th timeslot in the k'th frame is:

$$\hat{P}^0_{in}[k, j] = \frac{\bar{P}_{est}[k-1, j]}{G_{ADC}10^{bw_l[k-1,j]+\alpha}} \text{ (the estimation of the input power}$$

of time slot $j$, frame $k-1$) +

$$\frac{C\hat{P}_{interf}[k-1, j]\sum_{i=1}^{N_1} SIR_i^{target}[k-1, j]/SF_i}{G_{ADC}10^{bw_0[k,j]+\alpha}} \text{ (the estimation}$$

of the input power of newly arrived signals) −

$$\frac{C\hat{P}_{interf}[k-1, j]\sum_{i=1}^{N_2} SIR_i^{measure}[k-1, j]/SF_{i+N_1}}{G_{ADC}10^{bw_l[k-1,j]+\alpha}}$$

(the estimation of the input power of disappearing signals).

Equation 4 where $w_l[k-1, j]$ is the control word applying to the gain-adjustable amplifiers 105A, 105B at the end of the j'th timeslot in the (k−1)'th frame, and C is the constant term used in a WTRU transmit power calculation for balancing a potential power offset. Applying Equation 4 to Equation 3, the proper initial control words for the gain-adjustable amplifiers 105A, 105B are obtained as follows:

$$w_0[k, j] = w_l[k-1, j] + \frac{10}{b}\log\left(\frac{P_{ref} - C\hat{P}_{interf}[k-1, j]\sum_{i=1}^{N_1} SIR_i^{target}[k-1, j]/SF_i}{\bar{P}_{est}[k-1, j] - C\hat{P}_{interf}[k-1, j]\sum_{i=1}^{N_2} SIR_i^{measure}[k-1, j]/SF_{i+N_1}}\right).$$

Equation 5

AGC 300 operates in accordance with the present invention where $\hat{P}_{in}[k, j]$ is the initial input signal power in front of the gain-adjustable amplifiers 105A, 105B for the j'th timeslot in the k'th frame. In a second preferred embodiment, it is assumed that the BS does not know all of the information that is needed. For example, the BS may not know the following information in advance:

a) which code will be disappearing, b) the actual values of signal gain factors C for a newly arriving code, but the maximum value of the factor $C_{max}$ is known, and c) the spreading factors for each newly arriving code, but the minimum spreading factors $\{SF_i^{min}, i=1, \ldots, N_1\}$ are known.

Since it is preferred to overestimate the input power to prevent ADC 110 saturation, the estimated input power can be given as:

$$\hat{P}_{in}[k, j] = \frac{C_{max}\hat{P}_{interf}[k-1, j]\sum_{i=1}^{N_1} SIR_i^{target}[k-1, j]/SF_i^{min}}{G_{ADC}10^{bw_0[k,j]+\alpha}} + \frac{\bar{P}_{est}[k-1, j]}{G_{ADC}10^{bw_l[k-1,j]+\alpha}}.$$

Equation 6

Now applying the above estimated input power into the Equation 3, the result can be expressed as:

$$w_0[k, j] = w_l[k-1, j] + \frac{10}{b}\log\left(\frac{P_{ref} - C_{max}\hat{P}_{interf}[k-1, j]\sum_{i=1}^{N_1} SIR_i^{target}[k, j]/SF_i^{min}}{\bar{P}_{est}[k-1, j]}\right).$$

Equation 7

Furthermore, if it is assumed that the BS has no information about $C_{max}$ or $\{SF_i^{min}, i=1, \ldots, N_1\}$ or $\{SIR_i^{target}[k, j], i=1, \ldots, N_1\}$ in advance, the control word, based on Equation 7, reduces to:

$$w_0[k, j] = w_l[k-1, j] + \frac{10}{b}\log\left(\frac{P_{ref}}{\bar{P}_{est}[k-1, j]}\right).$$

Equation 8

Again, Equation 8 corresponds to overestimating the input power. It will generate smaller initial gain value for the gain-adjustable amplifiers and, therefore, prevent the ADC 110 from being saturated at the beginning of each time slot.

The foregoing describes a preferred example of an initialization scheme as per the invention. While this invention has been particularly shown and described with reference to a preferred embodiment, it will be understood by those skilled in the art that various changes in form and details may be made therein without departing from the scope of the invention as described hereinabove.

What is claimed is:

1. An automatic gain amplifier circuit comprising:
   (a) at least one gain-adjustable amplifier for receiving an analog signal, amplifying or attenuating the analog signal, and outputting a gain-adjusted signal;
   (b) at least one analog-to-digital converter for converting the gain-adjusted signal into a digital signal;
   (c) a power estimator for estimating the total power of the digital signal;
   (d) a comparator for comparing the estimated digital signal total power with a power reference value to generate an error signal;
   (e) an accumulator for accumulating the error signal and outputting a gain control signal which is used to control the gain of the at least one gain-adjustable amplifier; and
   (f) an initial value generator for calculating an initial control word and outputting the initial control word to the accumulator, the control word indicating a current time slot and a current frame.

2. The automatic gain amplifier circuit of claim 1 further comprising:

(g) a slot clock for outputting an index (j) of the current time slot to the initial value generator, and for outputting a reset signal to the accumulator.

3. The automatic gain amplifier circuit of claim 2 further comprising:
(h) a frame clock for outputting an index (k) of the current frame to the initial value generator, wherein the initial value generator calculates the initial control word in response to the accumulator receiving the reset signal.

4. The automatic gain amplifier circuit of claim 3 wherein the initial value generator calculates the initial control word $w_0[k, j]$ in response to the reset signal.

5. The automatic gain amplifier circuit of claim 3 wherein the rate of the slot clock is N times higher than that of the frame clock, where N is the number of time slots per frame.

6. The automatic gain amplifier circuit of claim 3 wherein the initial value generator receives system and measurement information associated with the current (j'th) time slot in the k−1 and k'th frames.

7. A receiver comprising:
(a) at least one gain-adjustable amplifier for receiving an analog signal, amplifying or attenuating the analog signal, and outputting a gain-adjusted signal;
(b) at least one analog-to-digital converter for converting the gain-adjusted signal into a digital signal;
(c) a power estimator for estimating the total power of the digital signal;
(d) a comparator for comparing the estimated digital signal total power with a power reference value to generate an error signal;
(e) an accumulator for accumulating the error signal and outputting a gain control signal which is used to control the gain of the at least one gain-adjustable amplifier; and
(f) an initial value generator for calculating an initial control word and outputting the initial control word to the accumulator, the control word indicating a current time slot and a current frame.

8. The receiver of claim 7 further comprising:
(g) a slot clock for outputting an index (j) of the current time slot to the initial value generator, and for outputting a reset signal to the accumulator.

9. The receiver of claim 8 further comprising:
(h) a frame clock for outputting an index (k) of the current frame to the initial value generator, wherein the initial value generator calculates the initial control word in response to the accumulator receiving the reset signal.

10. The receiver of claim 9 wherein the initial value generator calculates the initial control word $w_0[k, j]$ in response to the reset signal.

11. The receiver of claim 9 wherein the rate of the slot clock is N times higher than that of the frame clock, where N is the number of time slots per frame.

12. The receiver of claim 9 wherein the initial value generator receives system and measurement information associated with the current (j'th) time slot in the k−1 and k'th frames.

13. A base station comprising:
(a) at least one gain-adjustable amplifier for receiving an analog signal, amplifying or attenuating the analog signal, and outputting a gain-adjusted signal;
(b) at least one analog-to-digital converter for converting the gain-adjusted signal into a digital signal;
(c) a power estimator for estimating the total power of the digital signal;
(d) a comparator for comparing the estimated digital signal total power with a power reference value to generate an error signal;
(e) an accumulator for accumulating the error signal and outputting a gain control signal which is used to control the gain of the at least one gain-adjustable amplifier; and
(f) an initial value generator for calculating an initial control word and outputting the initial control word to the accumulator, the control word indicating a current time slot and a current frame.

14. The base station of claim 13 further comprising:
(g) a slot clock for outputting an index (j) of the current time slot to the initial value generator, and for outputting a reset signal to the accumulator.

15. The base station of claim 14 further comprising:
(h) a frame clock for outputting an index (k) of the current frame to the initial value generator, wherein the initial value generator calculates the initial control word in response to the accumulator receiving the reset signal.

16. The base station of claim 15 wherein the initial value generator calculates the initial control word $w_0[k, j]$ in response to the reset signal.

17. The base station of claim 15 wherein the rate of the slot clock is N times higher than that of the frame clock, where N is the number of time slots per frame.

18. The base station of claim 15 wherein the initial value generator receives system and measurement information associated with the current, j'th, time slot in the k−1 and k'th frames.

* * * * *

UNITED STATES PATENT AND TRADEMARK OFFICE
CERTIFICATE OF CORRECTION

| | |
|---|---|
| PATENT NO. | : 7,302,245 B2 |
| APPLICATION NO. | : 11/327864 |
| DATED | : November 27, 2007 |
| INVENTOR(S) | : Yang et al. |

It is certified that error appears in the above-identified patent and that said Letters Patent is hereby corrected as shown below:

Title page item (56), U.S. PATENT DOCUMENTS, page 2, left column, delete line 4 and insert therefor --2002/0048267 A1 4/2002 Jacques et al.--.

At section (56), OTHER PUBLICATIONS, page 1, right column, line 3, before the word "Conference", delete "Technology" and insert therefor --Technology--.

At column 4, line 33, after the words "denoted as", delete " $\hat{P}_{in}^{0}k,$ " and insert therefor -- $\hat{P}_{in}^{0}[k,j]$ .--.

Signed and Sealed this

Sixth Day of May, 2008

JON W. DUDAS
*Director of the United States Patent and Trademark Office*